United States Patent [19]

Chian

[11] Patent Number: 5,625,566

[45] Date of Patent: Apr. 29, 1997

[54] CONFIGURATION DEPENDENT AUTO-BIASING OF BIPOLAR TRANSISTOR

[75] Inventor: Mojy C. Chian, Satellite Beach, Fla.

[73] Assignee: Harris Corporation, Melbourne, Fla.

[21] Appl. No.: 382,346

[22] Filed: Feb. 1, 1995

[51] Int. Cl.$^6$ .................................................. H02M 7/53
[52] U.S. Cl. .................. 364/489; 364/488; 330/260
[58] Field of Search ........................ 364/578, 488, 364/489; 327/530, 100; 330/260, 85, 107, 149, 157; 257/580, 583, 587

[56] References Cited

U.S. PATENT DOCUMENTS

| | | | |
|---|---|---|---|
| 3,976,944 | 8/1976 | Kreng et al. | 325/421 |
| 4,202,031 | 5/1980 | Hesler et al. | 363/97 |
| 4,443,844 | 4/1984 | Grace | 363/132 |
| 4,481,483 | 11/1984 | Kawamura | 330/297 |
| 4,491,802 | 1/1985 | Uchida et al. | 330/260 |
| 4,638,260 | 1/1987 | Hamley | 330/254 |
| 5,068,811 | 11/1991 | Johnston et al. | 364/551.01 |
| 5,247,468 | 9/1993 | Henrichs et al. | 364/578 |
| 5,424,964 | 6/1995 | Machala, III et al. | 364/578 |

OTHER PUBLICATIONS

Dreifuss et al., "Novel method for calculating the noise figure of Microwave MESFET mixers," IEE Proceedings, Aug. 1989, pp. 289–292.

Hanseler et al., "Test Structures and measurement Techniques for the Charaterization of The Dynamic Behavior of CMOS Transistors on Wafer in the GHz Range,"IEEE, 1992, pp. 90–93.

Schilling and Belove, "Electronics Circuits"; pp. 212–213, 1979.

Primary Examiner—Kevin J. Teska
Assistant Examiner—Thai Phan
Attorney, Agent, or Firm—Charles E. Wands

[57] ABSTRACT

An auto-biasing virtual circuit mechanism for a bipolar transistor is independent of the biasing and the configuration of a signal waveform application circuit in which the transistor is installed. The virtual circuit comprises a plurality of AC signal coupling elements (capacitors) coupled in circuit between respective ones of a plurality of AC signal access terminals and respective ones of the base, collector and emitter electrodes of the transistor. Because of their frequency dependent impedance characteristics, each coupling capacitor effectively provides a short circuit coupling path for AC signals, while blocking or being an open circuit for DC bias inputs. Conversely, DC biasing is effected through large valued inductors, which provide short circuit coupling paths for DC bias inputs, while blocking or being open circuits for AC signal conditions. A controllable DC voltage bias source, which is coupled through an inductor to the emitter electrode of the transistor generates an output voltage corresponding to the difference between the collector voltage (Vc) and the required collector-emitter bias voltage (Vce) of the transistor, so that the effective differential voltage applied across the collector and emitter electrodes of the transistor is the desired value of Vce. The output terminal of a controllable collector current (Ic) current source is coupled directly to the collector electrode of the transistor.

2 Claims, 1 Drawing Sheet

CONFIGURATION DEPENDENT AUTO-BIASING OF BIPOLAR TRANSISTOR

FIELD OF THE INVENTION

The present invention relates in general to the testing and manufacture of electronic circuits and components, and is particularly directed to a virtual circuit mechanism for efficiently modelling AC signal coupling and DC biasing of a bipolar transistor, irrespective of the components of the physical circuit employed to supply biasing inputs to the transistor. As a result of this virtual circuit mechanism, the performance of the bipolar transistor may be readily tested prior to manufacture of an overall circuit design in which the transistor is to be incorporated, thereby effectively ensuring that the manufactured circuit will faithfully perform to its design specification.

BACKGROUND OF THE INVENTION

Electronic circuit designs are driven by various electrical signal parameters including information signal and noise signal specifications. In the course of conducting AC signal measurements on the performance of a circuit employing bipolar transistors, the operating point of a respective bipolar transistor is customarily predefined in terms of collector current (Ic) and collector-emitter voltage (Vce), as illustrated in the circuit schematic of FIG. 1. To establish these operating point conditions, a biasing circuit arrangement, such as that diagrammatically illustrated in FIG. 2, containing power supply voltage inputs and biasing resistors, through which the values of Ic and Vce are established, may be coupled to the transistor 11 of interest. In the non-limiting example of FIG. 2, the operating point of the transistor is established by coupling a collector bias supply voltage Vcc through a coupling resistor 13 to collector electrode 15, and coupling an emitter bias supply voltage Vee to emitter electrode 21. A further coupling resistor 23 may be coupled between collector electrode 15 and base electrode 25.

The value of the collector-emitter differential voltage Vce and the magnitude of collector current Ic are established by the values of Vcc, Vee and the bias resistors through which the power supply terminals of the biasing circuitry are coupled to the transistor. With such bias conditions established, an AC input signal waveform of interest may be applied to base electrode 25, and an output signal waveform measured at collector electrode 15, for example.

Because the operation of transistor 11 within the circuit of FIG. 2 depends upon the values of all of the components of the circuit, the measured performance values (e.g. characteristics of the output signal waveform at collector electrode 15) are necessarily affected by these biasing circuit components (power supply inputs and the coupling/biasing resistors). Due to this dependency, a custom bias circuit must be reconfigured each time a new transistor is to be evaluated, so that the measurement process is time consuming and computationally intensive. Indeed, even when successive transistors of the same type are to be tested, because the electronic parameters of each transistor are unique, the need to tailor the biasing components of the circuit for each performance measurement cannot be relaxed.

SUMMARY OF THE INVENTION

In accordance with the present invention, the need to employ a custom biasing circuit for each transistor, and conduct performance measurements that involve participation by all of the components of the circuit, and not merely the transistor, which necessarily introduces the effects of the biasing circuit into the measurement process, are effectively obviated by means of an auto-biasing virtual circuit mechanism, that is independent of the configuration of the biasing, signal waveform application circuit in which the transistor is installed.

For this purpose, the virtual circuit biasing mechanism of the present invention places a plurality of AC signal coupling elements (capacitors) in circuit between respective ones of a plurality of AC signal access terminals and respective ones of the base, collector and emitter electrodes of the transistor. Because of their frequency-dependent impedance characteristics, each coupling capacitor effectively provides a short circuit coupling path for AC signals, while blocking or being an open circuit for DC bias inputs. Conversely, establishing the transistor's operating point (Vce and Ic) by prescribed DC biasing of its collector and emitter electrodes is effected through large valued inductors, which provide short circuit coupling paths for DC bias inputs, while blocking or being open circuits for AC signal conditions.

Specifically, AC signal coupling paths are provided by means of capacitor elements connected between first, second and third AC access terminals and the collector, emitter and base electrodes of the bipolar transistor. For DC biasing, a first inductor is connected between the base electrode of the transistor and a first DC coupling terminal, and a second inductor is coupled between a controllable DC voltage bias source and the emitter electrode of the transistor. The controllable DC voltage bias source is operative to generate an output voltage corresponding to the difference between whatever voltage is present at the collector (Vc) and the required collector-emitter bias voltage (Vce) of the transistor, so that the effective differential voltage applied across the collector and emitter electrodes of the transistor is the desired value of Vce. The output terminal of a controllable collector current (Ic) current source is coupled directly to the collector electrode of the transistor.

DETAILED DESCRIPTION

Figure 1:
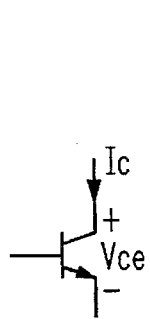
FIG. 1 is a circuit schematic of a bipolar transistor.
Figure 2:
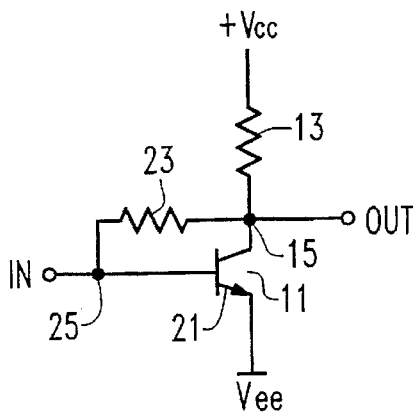
FIG. 2 diagrammatically illustrates a non-limiting example of a biasing circuit containing power supplies and biasing resistors, through which values of Ic and Vce for the transistor of FIG. 1 may be established.

Before describing the details of the auto-biasing virtual circuit mechanism of the present invention, which is independent of the configuration of the sources of DC biasing, and signal waveforms that are applied to the circuit in which the transistor is installed, it should be observed that the present invention resides primarily in what is effectively a computer-based tool for analyzing the performance of a bipolar transistor circuit. Such a design tool readily enables a circuit designer to expeditiously obtain an accurate prediction of the performance of the transistor circuit operating at a specified operating point. Since the present invention may be used to analyze any type of bipolar transistor, the configuration of the virtual circuit mechanism has been illustrated in the drawings by readily understandable schematic components, showing only those specific aspects that are pertinent to the present invention, so as not to obscure the disclosure with details which will be readily apparent to those skilled in the art having the benefit of the description herein. Thus, the illustrations of the Figures are primarily intended to illustrate the major utilitarian components of the inventive circuit analysis tool in a convenient schematic grouping, whereby the present invention may be more readily understood.

Figure 3:
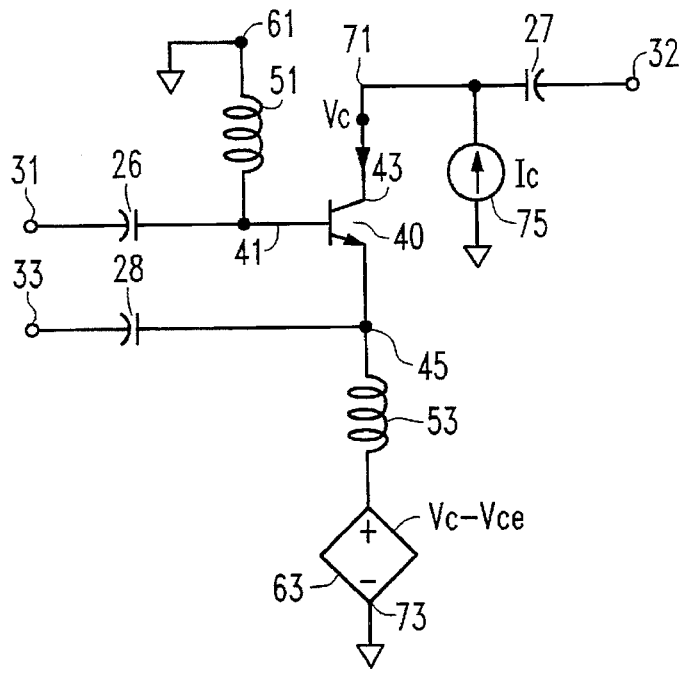
FIG. 3 schematically illustrates an auto-biasing circuit in accordance with an embodiment of the invention.
Figure 4:
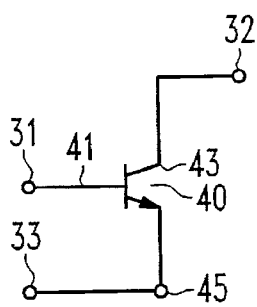
FIG. 4 schematically shows the AC equivalent circuit of FIG. 3.

Referring now to FIG. 3, the auto-biasing circuit in accordance with the present invention is schematically illustrated as comprising a plurality of AC signal coupling elements (capacitors) 26, 27 and 28 coupled in circuit between respective ones of a plurality of AC signal access terminals 31, 32, and 33 and respective ones of the base electrode 41, collector electrode 43 and emitter electrode 45 of a transistor 40. As pointed out above, each coupling capacitor effectively provides a short circuit coupling path for AC signals, while blocking or being an open circuit for DC bias inputs to transistor 40. FIG. 4 schematically shows the AC equivalent circuit of FIG. 3.

Setting the transistor's operating point by DC biasing of the collector and emitter electrodes is effected by means of a pair of large valued inductors 51, 53, which provide short circuit coupling paths for DC bias inputs, while blocking AC signal conditions. For this purpose, a first inductor 51 is connected between the base electrode 41 of transistor 40 and a first DC voltage coupling terminal 61. A second inductor 53 is coupled between a controllable DC voltage bias source 63 and the emitter electrode 45 of transistor 40. The output voltage generated by DC voltage bias source 63 is automatically adjusted, so that it is set at a value that takes into account the respective magnitudes of the collector voltage (Vc) terminal 71 and the required collector-emitter bias voltage (Vce) of the transistor.

Figure 5:
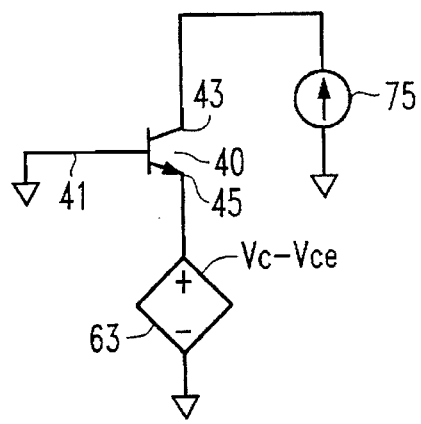
FIG. 5 schematically shows the DC bias equivalent circuit of FIG. 3.

Specifically, for virtual circuit simulation of transistor 11 and measurement of its performance in the presence of a set of operational parameters, transistor 11 and the biasing circuit of FIG. 3 are modelled using a conventional circuit analysis routine executable on a desktop computer. Within the circuit analysis simulation, the variable voltage produced by DC voltage bias source 63 is set at a value that corresponds to the difference between Vc terminal 71 and the required collector-emitter bias voltage (Vce) of the transistor, associated with the operating point of the transistor. Because inductor 53 is a short circuit at DC conditions, there is no effective voltage drop across the inductor, so that the effective differential voltage bias applied across the collector and emitter electrodes of transistor 11 is the desired value of Vce. Within the virtual circuit simulation, the value of collector current (Ic) is established by means of a controllable collector current bias source 75, the output of which is coupled directly to collector electrode 43. FIG. 5 schematically shows the DC bias equivalent circuit of FIG. 3.

Because inductors 51 and 53 are located between DC voltage bias terminals 61 and 63 and the base and emitter electrodes 41 and 45, to which the AC signal-coupling capacitors 26 and 28 are connected, they permit AC access directly to the respective electrodes of the transistor, without preventing DC bias of the same, whereby both AC and DC conditions can be simultaneously effected without mutual interference.

As will be appreciated from the foregoing description, the virtual circuit biasing/coupling mechanism of the present invention not only obviates the need to reconfigure a custom biasing circuit for each new transistor to be analyzed, but because the DC bias coupling components (inductors) are invisible to DC bias inputs, while blocking AC signals, and the AC bias coupling components (capacitors) are invisible to AC signal inputs, while blocking DC bias, performance measurements are effectively independent of the virtual circuit. Also, the use of a controllable DC voltage bias source, whose output corresponds to the difference between the collector voltage and the required collector-emitter bias voltage (Vce) of the transistor, ensures that the effective differential voltage applied across the collector and emitter electrodes of the transistor is at the required value of Vce, regardless of the transistor used.

Thus, when modelling an electronic circuit architecture including one or more sources of electrical influence associated with a respective bipolar transistor, the operating point of each transistor may be set in the manner described above, and then the behavior of the transistor analyzed in the presence of the sources of electrical influence, so that the performance of the transistor and thereby that of the electronic circuit in which it is employed may be determined prior to manufacture.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of providing DC bias to respective emitter, base and collector electrodes of a bipolar transistor, while simultaneously providing AC signal access to said emitter, base and collector electrodes of said bipolar transistor comprising the steps of:

(a) connecting a first AC signal coupling element between a first AC access terminal and said emitter electrode of said bipolar transistor, a second AC signal coupling element between a second AC access terminal and said base electrode of said bipolar transistor, and a third AC signal coupling element between a third AC access terminal and said collector electrode of said bipolar transistor;

(b) coupling a first DC voltage coupling element between a reference terminal and said base electrode of said bipolar transistor;

(c) applying a DC bias voltage through a second DC voltage coupling element to said emitter electrode of said bipolar transistor, wherein said DC bias voltage corresponds to the difference between a prescribed collector voltage and a volt across said collector and emitter electrodes of said bipolar transitor; and (d) applying a DC bias current to said collector electrode of said bipolar transistor.

2. A method of measuring the performance of a bipolar transistor at a prescribed operating point, prior to reducing said bipolar transistor into tangible form in a bipolar transistor architecture, comprising the steps of:

(a) generating a model of said bipolar transistor, which model includes sources of electrical influence associated with said bipolar transistor;

(b) connecting first, second and third AC signal coupling elements between respective ones of first, second and third AC access terminals and the emitter, base and collector electrodes of said bipolar transistor, and setting an operating point of said bipolar transistor by coupling a first DC voltage coupling element between a reference terminal and said base electrode of said bipolar transistor, applying a DC bias voltage through a second DC voltage coupling element to said emitter electrode of said bipolar transistor, wherein said DC bias voltage corresponds to the difference between a prescribed collector voltage and voltage across the collector and emitter electrodes of said bipolar transistor, applying a DC bias current to said collector electrode of said bipolar transistor; and (c) analyzing the behavior of said bipolar transistor in the presence of said sources of said prescribed electrical influence, and generating an output signal representative of said performance of said bipolar transistor.

* * * * *